United States Patent [19]

Imamura et al.

[11] Patent Number: 5,153,888
[45] Date of Patent: Oct. 6, 1992

[54] OPTICAL LASER FREQUENCY STABILIZER

[75] Inventors: Makoto Imamura; Koji Akiyama; Satoshi Yoshitake, all of Tokyo, Japan

[73] Assignee: Yokogawa Electric Corporation, Tokyo, Japan

[21] Appl. No.: 737,769

[22] Filed: Jul. 30, 1991

[30] Foreign Application Priority Data

Aug. 22, 1990 [JP] Japan .................. 2-220743
Apr. 26, 1991 [JP] Japan .................. 3-97715

[51] Int. Cl.⁵ .............................. H01S 3/13
[52] U.S. Cl. .......................... 372/32; 372/38; 372/31; 372/13
[58] Field of Search ............ 372/32, 31, 38, 13

[56] References Cited

U.S. PATENT DOCUMENTS 4,590,597 5/1986 Long-Sheng et al. ................. 372/32

Primary Examiner—Leon Scott, Jr.
Attorney, Agent, or Firm—Moonray Kojima

[57] ABSTRACT

An optical laser frequency stabilizer which is simple, inexpensive, produces an unmodulated output, and a highly controlled oscillation frequency, wherein signals supplied to a master laser are modulated with a signal which is switched between four or more different levels to control the oscillation frequency of the master laser to the frequency of an absorption line; and wherein the beat frequency of signals from the master laser and a slave laser is counted by an up-down frequency counter in synchronism with the modulation signal and, in response to the obtained total count, the oscillation frequency of the slave laser is controlled to a frequency based on the center frequency of the oscillation of the master laser so that an unmodulated output is generated which is not affected by variations in the powers of the laser beams. The laser frequency can be offset from the frequency of the absorption line, and also the offset frequency can be varied continuously.

6 Claims, 12 Drawing Sheets

Output of Photo Detector 21

Output of Mixer 28

OPTICAL LASER FREQUENCY STABILIZER

BACKGROUND OF THE INVENTION

1. Field of Invention

This invention relates to frequency stabilizers for optical lasers; and more particularly, to such stabilizers for semiconductor lasers.

2. Description of the Prior Art

In the field of optical instrumentation, an optical laser frequency stabilizer is used to measure frequencies at high accuracy and with high resolution.

FIG. 1 is a block diagram depicting a conventional optical laser frequency stabilizer, wherein a semiconductor laser 1 is directly modulated to control its oscillation frequency to the center of the absorption line of atoms or molecules. The output light from laser 1, is divided into two beams by a beam splitter 2, one beam being incident on an absorption cell 3, sealed with a reference substance, and the other beam (labeled "output light") being the output signal of the apparatus. The light transmitted through cell 3 is detected by a photodetector 4 and converted into an electrical signal. This electrical signal is applied to a synchronous detector circuit 5 which includes a lock in amplifier. The oscillation frequency of laser 1 is modulated with the output current from a signal generator 8. Detector circuit 5 receives the output from generator 8 as a reference signal, and detects the electrical output signal from photodetector 4 in synchronism with this reference signal. A PI(proportion, integral) control circuit 6 controls the output current from laser 1 to make the output from detector circuit 5 constant. The output from control circuit 6, the oscillation output from generator 8, and the output from a bias current source 9, are summed up by an adding circuit 7. The output from adding circuit 7 is applied to laser 1. As a result, the oscillation frequency of laser 1 is controlled to the center of the absorption line of the atoms or molecules of the reference substance in absorption cell 3. The absolute value of the frequency of the "output light" from beam splitter 2 is accurately determined by the atoms or molecules.

In this conventional apparatus, the output light is frequency modulated. Thus, the instantaneous value of the frequency lacks stability. Accordingly, the apparatus is unsuited for interference instrumentation and other applications, and hence extensive application thereof does not exist.

In order to overcome this deficiency, another type of apparatus has been constructed in which the output light from the semiconductor laser is externally modulated with an acousto-optical modulator and controlled to the frequency of the absorption line of the atoms or molecules to produce an unmodulated output. However, this conventional apparatus also is not sufficiently stable because the acousto-optical modulator is unstable in operation.

SUMMARY OF THE INVENTION

Accordingly, an object of the invention is to overcome the aforementioned and other deficiencies and disadvantages of the prior art.

Another object is to provide an optical laser frequency stabilizer which is simple in structure, produces an unmodulated output light, and has a highly regulated or controlled oscillation frequency.

DETAILED DESCRIPTION OF THE PREFERRED EMBODIMENTS

Figure 1:
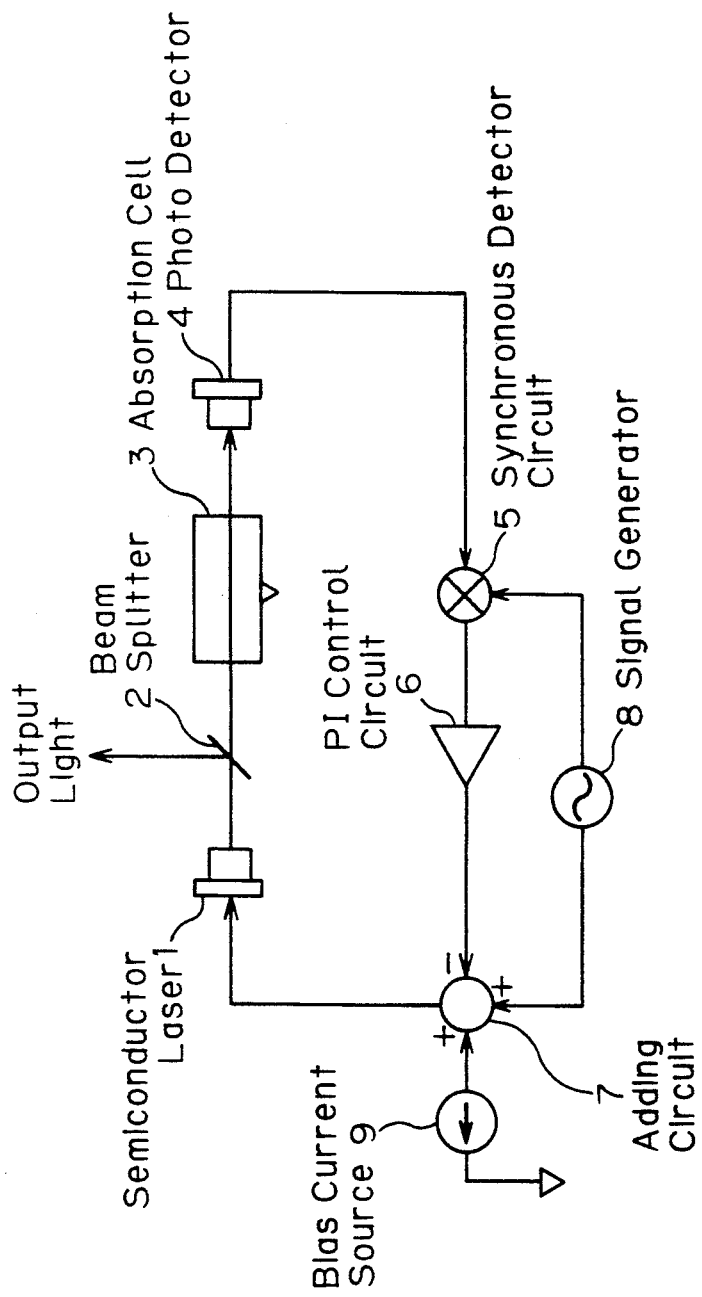
FIG. 1 is a block diagram depicting a conventional optical laser frequency stabilizer.
Figure 2:
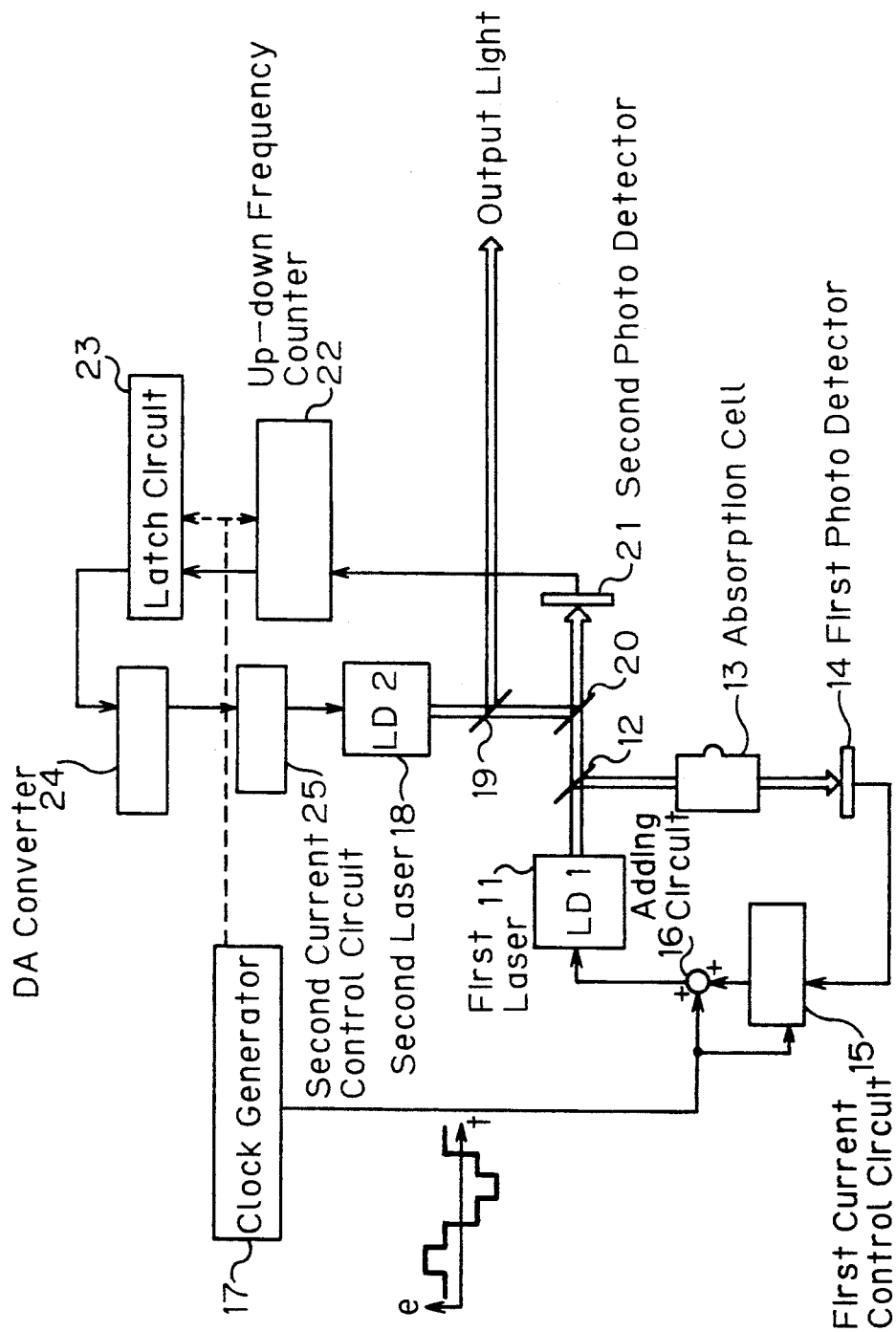
FIG. 2 is a block diagram depicting a first illustrative embodiment of the invention.

FIG. 2 depicts an optical laser frequency stabilizer comprising a first semiconductor laser 11 (called "master laser LD1"); a first beam splitter 12, which divides the output light from laser 11 into two beams; an absorption dell 13, which receives light beam which is reflected by splitter 12; a first photodetector 14 for detecting the light transmitted through cell 13; a clock generator 17, forming a first signal generator that modulates laser 11; a first current control circuit 15; an adding circuit 16 for adding the modulating output signal from clock generator 17 to the output from current control circuit 15; a second semiconductor laser 18 (called "slave laser LD2"); a second beam splitter 19, which extracts a part of the light output from laser 18, as the output light from the apparatus; a third beam splitter 20, which forms an optical means for providing the sum of the output light from laser 11 and the output light from laser 18; a second photodetector 21 which detects the output light from beam splitter 20; an up-down frequency counter 22; a latch circuit 23, which latches the output from up-down counter 22 in synchronism with the output from clock generator 17; a DA (digital to analog) converter 24 which converts the digital output from latch circuit 23 into analog form; and a second current control circuit 25.

Absorption cell 13 is sealed with a reference substance which shows an absorption line at a certain frequency. First control circuit 15 receives the output from clock generator 17 as its reference signal, and detects the output from photodetector 14 in synchronism with the reference signal. Also, first control circuit 15 controls the oscillation frequency of master laser 11 to the center of the absorption line described above, by performing proportional plus integral (PI) action. Up-down frequency counter 22, in which the up-down action is controlled in synchronism with the output from the clock generator 17, counts the beat frequency of signal outputted by photodetector 21. Second current control circuit 25 receives the output from DA converter 24, and controls slave laser 18 so that slave laser 18 agrees in oscillation frequency with master laser 11, by performing PI functions.

Figure 3:
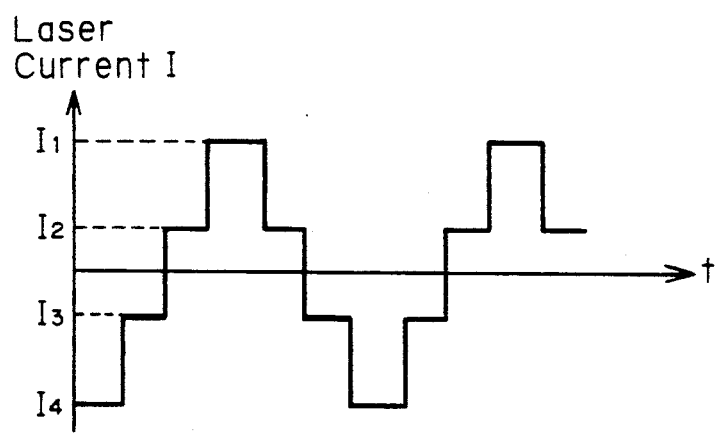
FIG. 3 is a diagram depicting the output current from the embodiment of FIG 2, as plotted against time.
Figure 4:
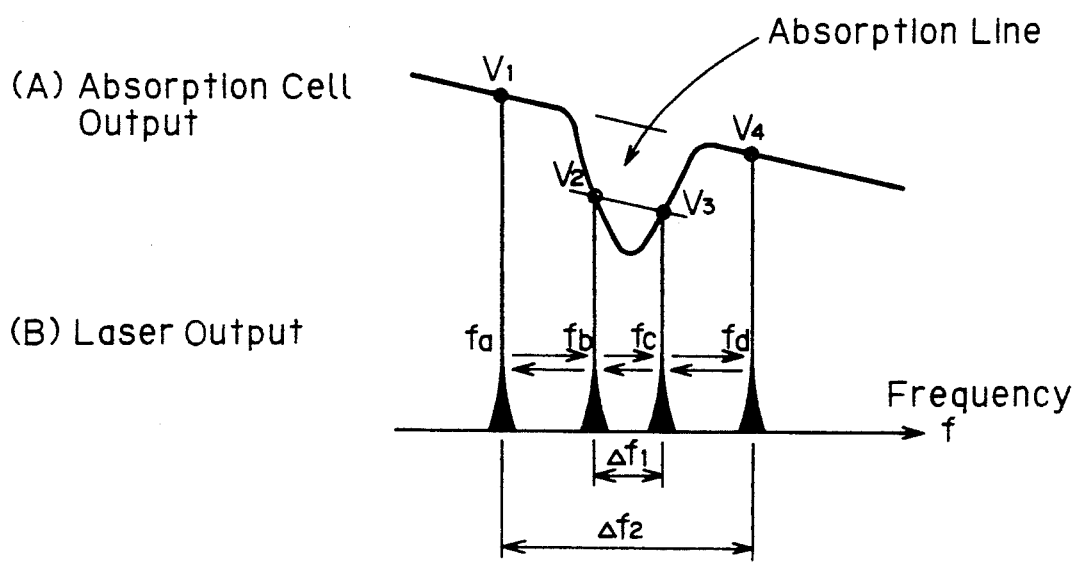
FIGS. 4A and 4B are diagrams depicting the output current from the embodiment of FIG. 2, as plotted against frequency.

The FIG. 2 embodiment operates as follows. The laser beam from laser 11 is modulated with the modulating signal from clock generator 17, as shown in FIG. 3. Correspondingly, the oscillation frequency of laser 11 varies in a stepwise manner and is switched between four values $f_a$, $f_b$, $f_c$, $f_d$ as shown in FIG. 4, line (B). The modulation levels (see FIG. 3) $I_1$-$I_4$ of the driving current are previously determined in such a manner that $\Delta f_1 = f_b - f_c$ is equal to the half-value width of the absorption line and that $\Delta f_2 = f_a - f_d$ is sufficiently wider that the absorption line. As an example, where acetylene ($C_2H_2$) is used as the reference substance in absorption cell 13, it follows that $\Delta f = 500$ MHz and $\Delta f_2 = 2$ GHz. Thus, as shown in FIG. 4, line (A), in the neighborhood of the absorption line arising from absorption cell 13, the output from photodetector 14 varies to $V_1$, $V_2$, $V_3$, $V_4$, corresponding to the various values of the laser frequency, i.e. $f_a$, $f_b$, $f_c$, $f_d$.

Current control circuit 15 receives the output from clock generator 17 as its reference signal, weights the various values, and integrates them to perform synchronous detection. Control circuit 15 produces a negative voltage given by $$V_{out} = k \cdot \{(V_1 - V_4)/(f_a - f_d) - (V_2 - V_3)/(f_b - f_c)\} \quad (1)$$

wherein k is a proportional constant. Voltage $V_{out}$ is fed back to laser 11 to provide negative feedback. The oscillation frequency of master laser 11 is controlled so that the relation $V_{out} = 0$ holds, i.e.

$$(V_1 - V_4)/(f_a - f_d) = (V_2 - V_3)/(f_b - f_c) \quad (2)$$

As a result, the average value, or the center, of the frequency of the modulated output light from the master laser 11 coincides with the center of the absorption line.

Since the output light from slave laser 18 is combined with the output light from master laser 11 by beam splitter 20, the difference between the frequencies of the two laser beams, i.e. a beat frequency, appears at the output of second photodetector 21.

It is assumed that counter 22 is stopped from counting when master laser 11 is oscillating at frequency $f_a$ or $f_d$ in response to the signal from clock generator 17, and that counter 22 counts the beat frequency downward when master laser 11 is oscillating at $f_b$. Also, it is assumed that when master laser 11 is oscillating at $f_c$, counter 22 counts upward.

Figure 5:
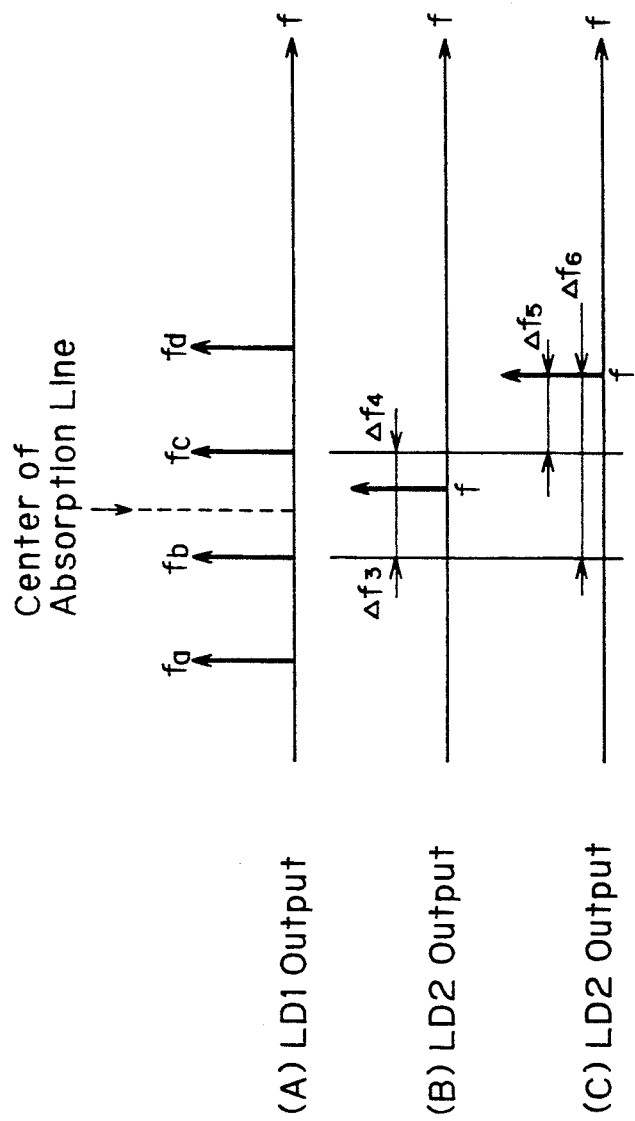
FIGS. 5A-5C, comprising lines (A), (B) and (C), are diagrams depicting the output current from the first and second lasers in the embodiment of FIG. 2, as plotted against frequency.

As shown in FIG. 5, lines (A) and (B), beat frequencies of $\Delta f_3$ and $\Delta f_4$, are applied to counter 22 when the oscillation frequency of laser 11 is $f_b$ and $f_c$, respectively. The difference calculated, and a voltage proportional to $\Delta f_4 - \Delta f_3$ is delivered from DA converter 24. Because the output from DA converter 24 is controlled to 0 by control circuit 25, the relationship $\Delta f_4 = \Delta f_3$ holds. The oscillation frequency of slave laser 18 is controlled to the middle value $f_b$ and $f_c$, or the center of the absorption line. Consequently, unmodulated output light, whose frequency is controlled to the center of the absorption line, is obtained from beam splitter 19.

In this optical laser frequency stabilizer, the output light of the apparatus (labeled "output light" and emitted by beam splitter 19) is accurately controlled to the center of the absorption line without being affected by variations of the powers of the laser beams, because the outer characteristics of the absorption line is used as the reference in controlling the frequency of master laser 11. Specifically, as shown in FIG. 4, line (A), if the output values $V_1$, $V_2$, $V_3$, $V_4$ from photodetector 14 are varied according to the powers of the light beams, the average value of the frequency of master laser 11 is coincident with the frequency of the center of the absorption line, provided that the gradient of the line connecting the two points $V_1$ and $V_4$, located outside the absorption line with respect to the frequency axis, agrees with the gradient of the line connecting the two points $V_2$ and $v_3$, lying on the absorption line, i.e. equation (2), is satisfied.

Since slave laser 18 is not modulated, an unmodulated output is obtained. On the other hand, the beat output from photodetector 21 is modulated. Thus, the oscillation frequency of slave laser 18 is accurately controlled to the frequency of the absorption line. In addition, since no acousto-optical modulator is used, as in the prior art, added material costs and electrical power consumed, are reduced.

In the FIG. 2 embodiment, the operations of the latch, the DA conversion, PI action, and the clock generator, as well as other operations, can be performed under the control of a microcomputer or the like, for example, in a digital manner. The difference $f_b - f_c$ is not limited to the half-value width. It is only necessary that the difference be less than the width of the absorption line.

The number of modulation levels the current can take is not limited to four. Interference noise and other factors causing variations can be averaged by switching the current between more different values. That is, in the above embodiment, the amplitude varies twice in the positive domain and also twice in the negative domain. The amplitude can be changed three times or more in each domain. The order in which the amplitude of the modulating signal is varied is not limited to the scheme illustrated in FIG. 3; rather, any desired sequence can also be adopted.

In addition the absorption line of the molecules of acetylene, the absorption lines of various other molecules, such as $^{13}C_2H_2$, HCN and $NH_3$, can be used as the reference substance in absorption cell 13. Also, the absorption lines of atoms, such as Rb and Cs, can be used.

Figure 6:
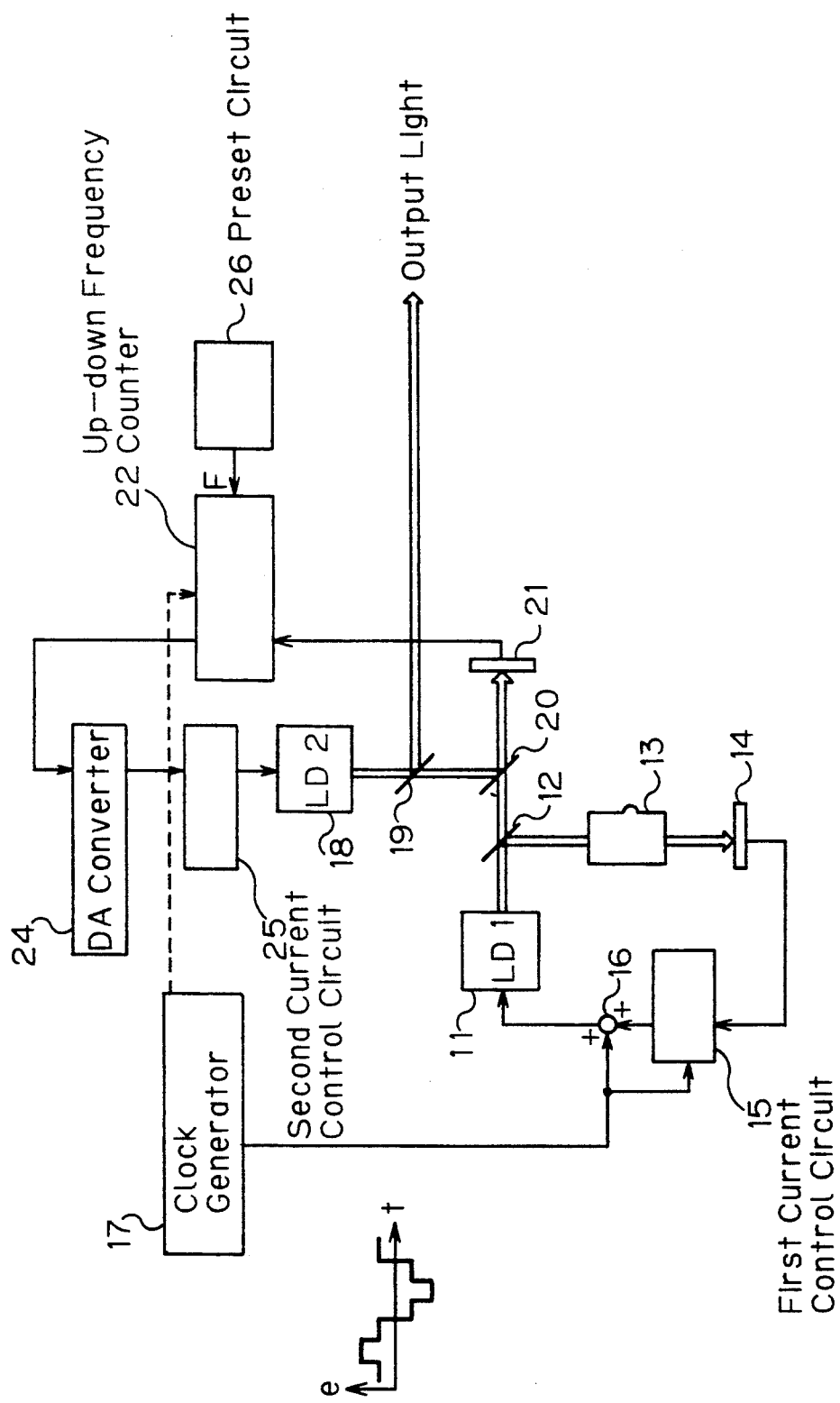
FIG. 6 is a block diagram depicting a second illustrative embodiment of the invention.

FIG. 6 depicts another optical laser frequency stabilizer wherein the output light is controlled to a frequency that is shifted with respect to the absorption line by a given value. The same components in the embodiments of FIGS. 2 and 6 are indicated by the same reference numerals and will not be further described hereat for clarity of description. Also, for simplification of description, latch circuit 23 of FIG. 2, is omitted. The embodiment of FIG. 6 is similar to the embodiment of FIG. 2, except that a preset value can be supplied to counter 22 every half period of the modulating signal.

The operation of the FIG. 6 embodiment is now described with reference to FIG. 5, lines (B) and (C). Where the oscillation frequency of slave laser 18 lies between $f_b$ and $f_c$, as shown in FIG. 5, line (B), up-down frequency counter 22 is preset at F by preset circuit 26. Note that $$F \leq |f_b - f_c| \tag{3}$$

The mode of operation of counter 22 is switched in the same way as in the embodiment of FIG. 2. In particular, when the master laser 11 is oscillating at $f_a$ or $f_d$, counter 22 does not count. When master laser 11 is oscillating at $f_b$, counter 22 counts downward. When master laser 11 is oscillating at $f_c$, counter 22 counts upward. As a result, DA converter 24 produces a voltage proportional to $(\Delta f_4 - f_3 + F)$. since current control circuit 25 controls the output from dA converter 24 to 0, the following relation holds $$\Delta f_4 - \Delta f_3 + F = 0 \tag{4}$$

This can be changed into the form $$\Delta f_4 = \Delta f_3 - F \tag{5}$$

From this equation, is obtained $$f_c - f = f - f_b - F \tag{6}$$

The frequency of the center of the absorption line is given by $$f_{cc} = (f_b + f_c)/2 \tag{7}$$

Therefore, the following holds $$f = f_{cc} + F/2 \tag{8}$$

This means that the oscillation frequency can be regulated to a frequency that is offset from the center of the absorption line by F/2.

Similarly, the oscillation frequency can be regulated to a frequency shifted with respect to the center of the absorption line by $-F/2$. That is counter 22 is set at $-F$ by preset circuit 26. When master laser 11 is oscillating at $f_b$, counter 22 is made to count upward. When laser 11 is oscillating at $f_c$, counter 22 is caused to count downward.

Where the oscillation frequency of slave laser 18 is outside the range from $f_b$ to $f_c$, as shown in FIG. 5, line (C), counter 22 is set a F by preset circuit 26. Note that $$F \geq f|f_b - f_c| \tag{9}$$

In this mode, when the oscillation frequency of master laser 11 is either $f_b$ or $f_c$, counter 22 counts downward. When the downward count is completed, DA converter 24 produces a signal which is proportional to $(F - \Delta f_5 - \Delta f_6)$. Since current control circuit 25 controls output from DA converter 24 to 0, the following relation holds $$F - \Delta f_5 - \Delta f_6 = 0 \tag{10}$$

This can be modified into the form $$F = \Delta f_5 + \Delta f_6 \tag{11}$$
$$= f - f_c + f - f_b$$
$$= 2f - 2f_{cc} \tag{12}$$

Finally, the following relation is obtained $$f = f_{cc} + F/2 \tag{13}$$

It follows that the oscillation frequency can be regulated to a frequency that is shifted with respect to the center of the absorption line by F/2. Likewise, the frequency can be regulated to a frequency shifted with respect to the center of the absorption line by $-F/2$ by setting counter 22 at $-F$ by means of preset circuit 26 and causing counter 22 to count upward when the oscillation frequency of master laser 11 is $f_b$ or $f_c$.

The stabilizer of FIG. 6 yields the same advantages as those attained by the embodiment of FIG. 2. In addition, the oscillation frequency can be regulated to a frequency shifted with respect to the center of the absorption line by a given value, by presetting counter 22 at a desired value. Also, the embodiment can be operated as an optical frequency stabilizer by sweeping the value preset into counter 22. Furthermore, advantageously, reductions in costs are attained by dispensing with expensive synthesizers which would normally be needed to generate an offset frequency. Also, the timing for supplying preset values to the counter 22 is not restricted to half periods of the modulation signals.

Figure 7:
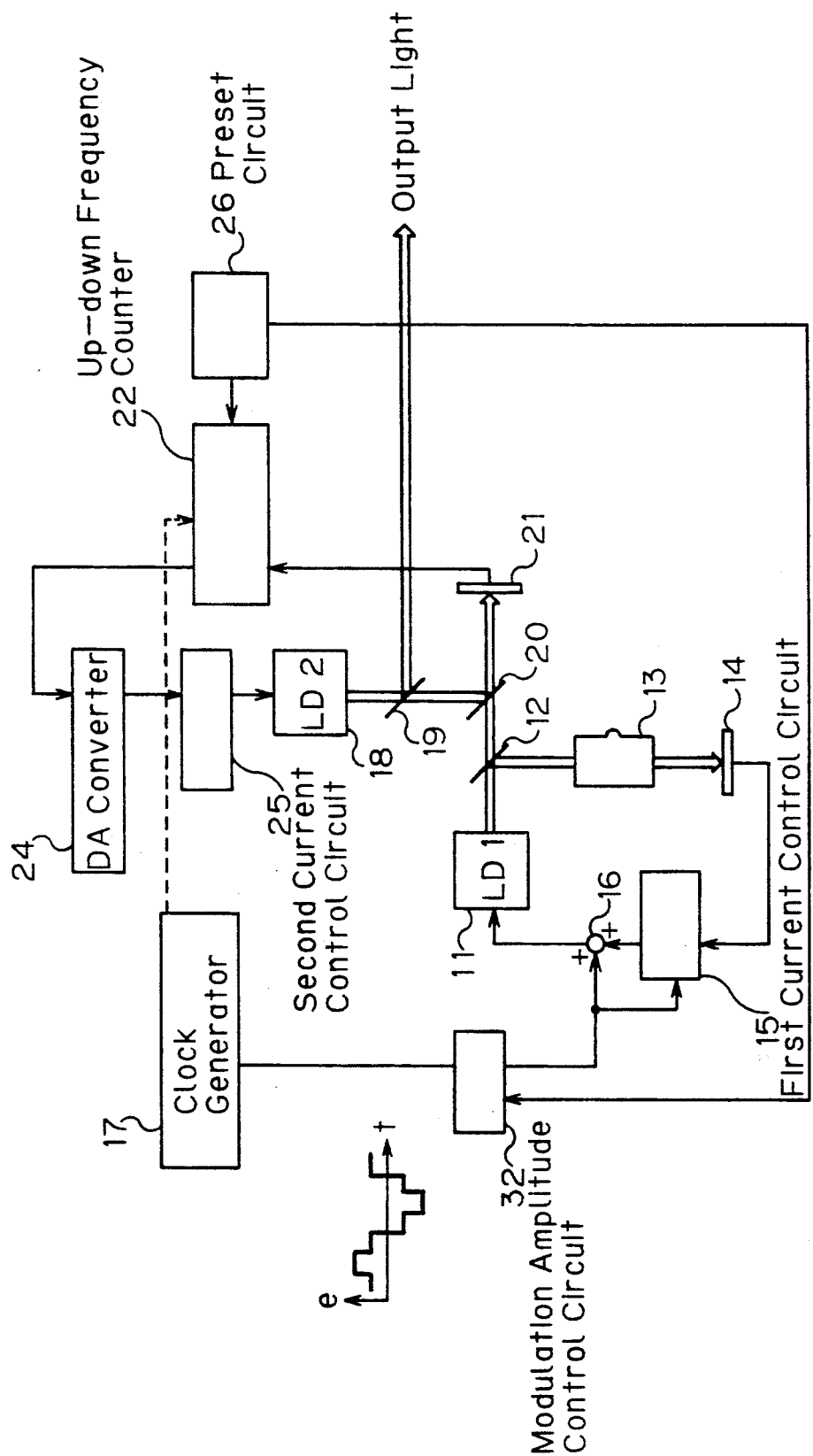
FIG. 7 is a block diagram depicting a third illustrative embodiment of the invention.

FIG. 7 depicts an embodiment which is similar to the embodiment of FIG. 6, except that means 32 are provided for eliminating the blind spots of the offset frequency. The output from clock generator 17 and an output from preset circuit 26 are applied to a modulation amplitude control circuit 32, which generates an output which is fed to current control circuit 15 and to adding circuit 16. In the embodiment of FIG. 6, if the frequency of slave laser 18 is made equal to $f_b$ or $f_c$ by the frequency shift made by preset circuit 26, the beat frequency $f - f_b$ or $f_c - f$, detected by photodetector 21, becomes equal to 0. Thus, the counter 22 cannot count. This makes it impossible to control the frequency offset. To prevent this, in the embodiment of FIG. 7, the preset value is detected at this time, and the amplitude of the output from generator 17 is varied by modulation amplitude control circuit 32.

Figure 8:
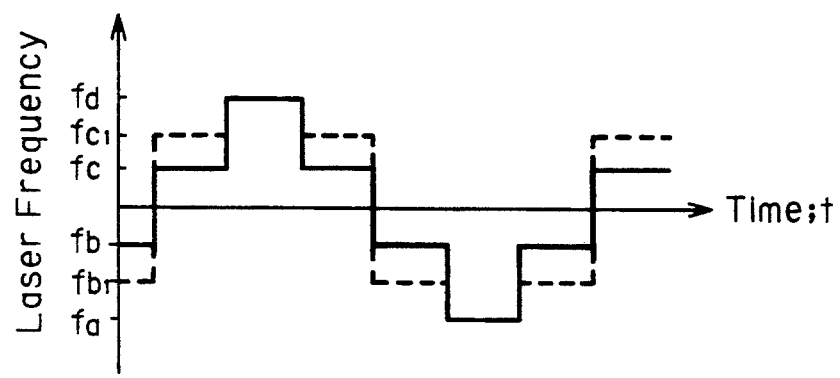
FIG. 8 is a diagram depicting the laser frequency obtained from the third embodiment of FIG. 7, as plotted against time.
Figure 9:
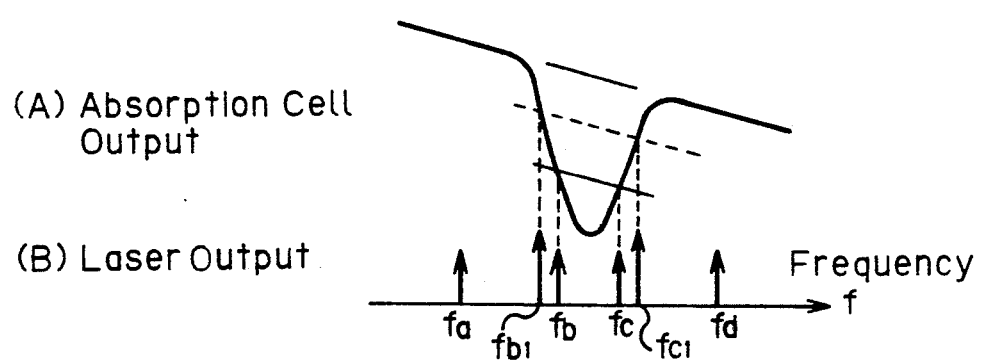
FIGS. 9A and 9B are diagrams depicting the laser frequency obtained from the third embodiment of FIG. 7, as plotted against frequency.

In FIGS. 8 and 9, the laser oscillation frequency is plotted on the time axis and on the frequency axis, respectively. The degree of modulation of the oscillation frequency of the laser varies from $f_b$ indicated by the solid line to $f_{b1}$, indicated by the broken line and also from $f_c$ to $f_{c1}$. As a result, neither the beat frequency $f - f_{b1}$ nor $f_{c1} - f$ becomes null. This permits counter 22 to count. Hence, the frequency f of slave laser 18 can be controlled to $f_b$ or $f_c$. In practice, however, the spectrum of the frequency emitted by the laser has a width Thus, it is necessary to change the degree of modulation within a given range close to the preset value.

The FIG. 7 embodiment yields the same advantages as those attained by the embodiment of FIG. 6. Additionally, the FIG. 7 embodiment eliminates the blind spots of the frequency offset. That is, the offset frequency deviating from the laser frequency can be continuously varied.

Figure 10:
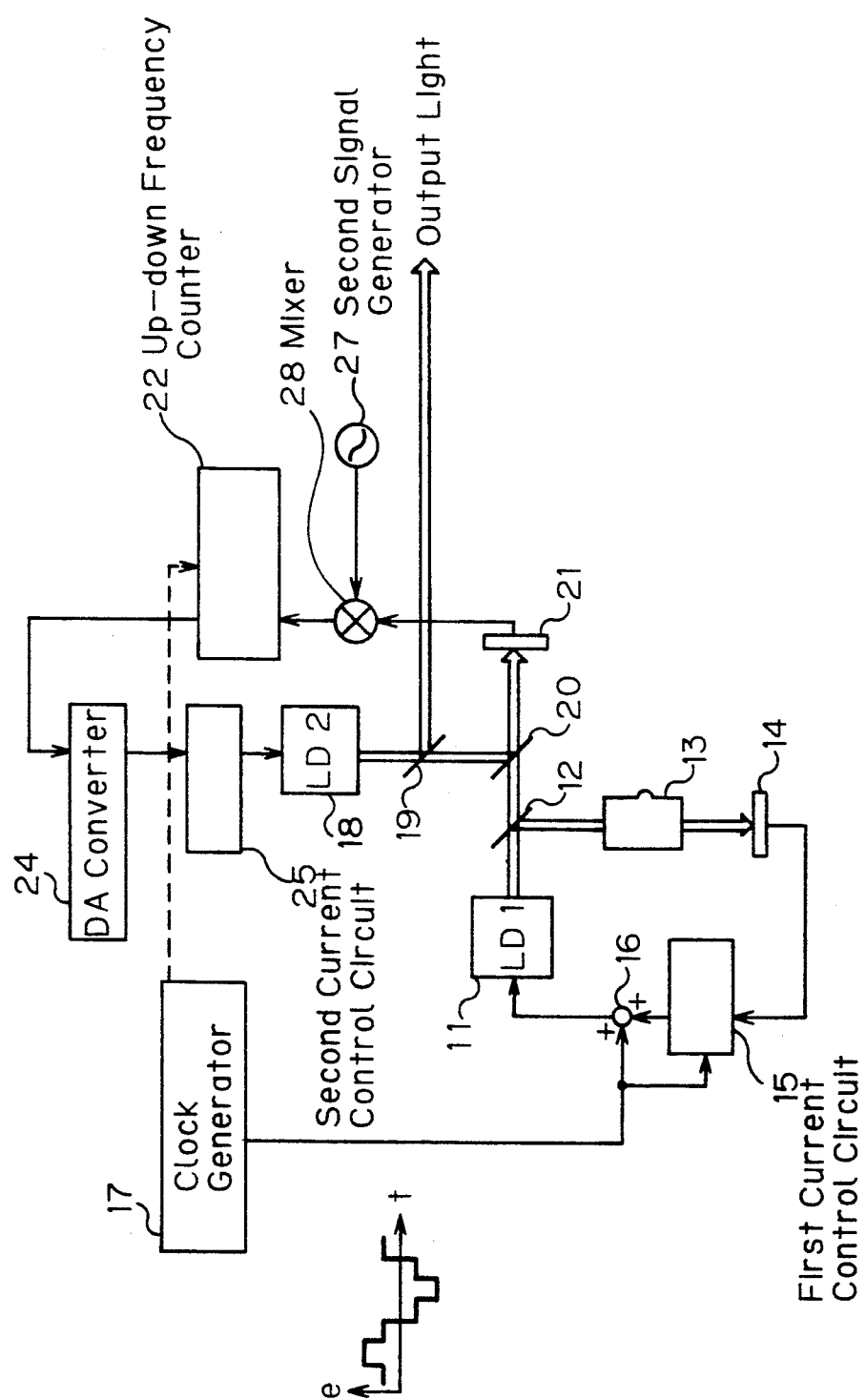
FIG. 10 is a block diagram depicting a fourth illustrative embodiment of the invention.

FIG. 10 depicts another stabilizer wherein the frequency of the laser output light is controlled to a frequency offset from the frequency of the absorption line by a given value. This embodiment is similar to the embodiment of FIG. 2 except as follows. The latch circuit 23 is omitted for sake of convenience. A second signal generate 27 and a double-balanced mixer 28 are added. Mixer 28 produces the product of the output from second generator 27 and the output from photodetector 21. The beat frequency of the output from photodetector 21 is stepped down by mixer 28 and then counted by counter 22. As a result, the oscillation frequency of slave laser 18 is controlled by current control circuit 25 so that the oscillation frequency of slave laser 18 is offset from the oscillation frequency of master laser 11 by a value equal to the oscillation frequency of generator 27.

Figure 11:
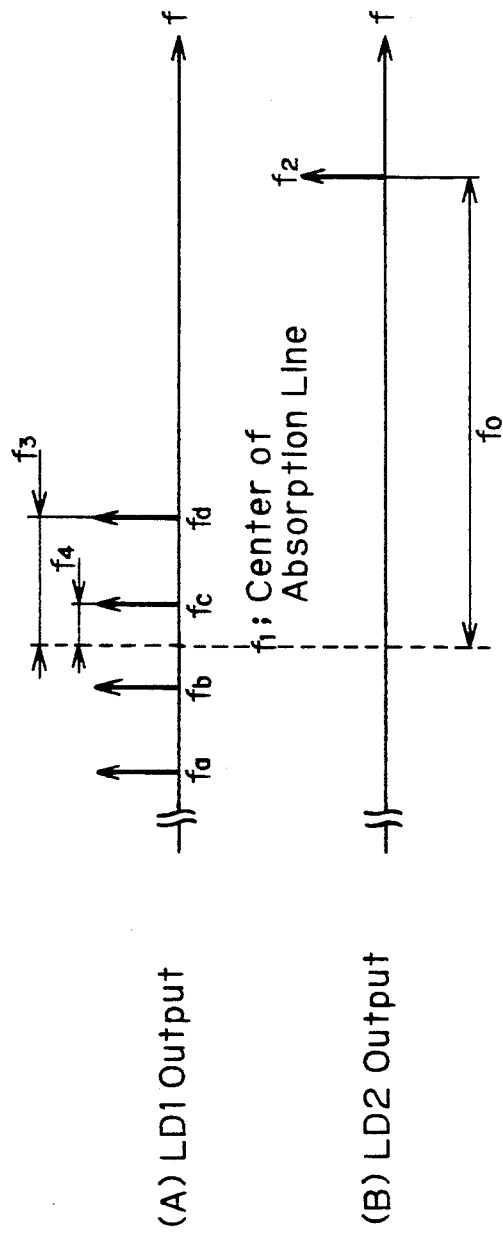
FIGS. 11A and 11B, comprising lines (A) and (B), are diagrams depicting the outputs from the first and second lasers in the fourth embodiment of FIG. 10, as plotted against frequency.
Figure 12:
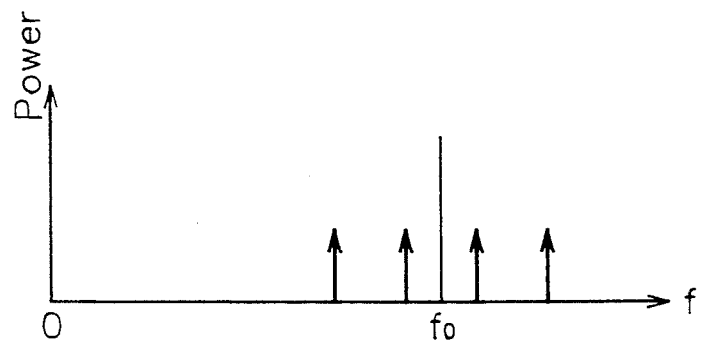
FIGS. 12A and 12B, comprising lines (A) and (B), are diagrams depicting the output from the photodiode 21 and the output from the mixer 28 in the fourth embodiment of FIG. 10.
Figure 12:
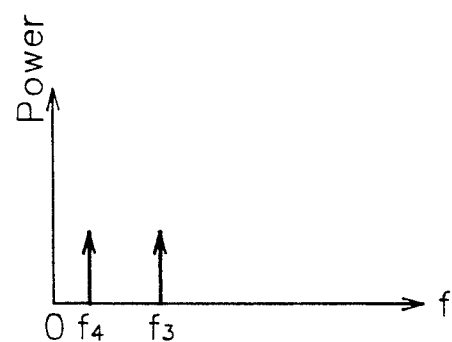

The operation of the FIG. 10 embodiment is illustrated in FIGS. 11 and 12, wherein the spectrum $f_1$ of master laser 11 controlled to the frequency of the absorption line is shown in FIG. 11, line (A). The oscillation frequency $f_o$ of generator 27 with respect to the frequency of the absorption line. Under this condition, the output spectrum of photodetector 21 takes the form shown in FIG. 12, line (A). The output spectrum of mixer 28 is shown in FIG. 12, line (B), wherein the spectral lines $f_a$, $f_b$ and $f_d$, $f_c$ shown in FIG. 11, line (A) are superimposed. In this manner, the oscillation frequency $f_2$ of slave laser 18 is controlled to a frequency offset from the center frequency $f_1$ by $f_o$. The oscillation frequency $f_2$ is swept by sweeping the frequency $f_o$.

The FIG. 10 embodiment yields the same advantages as those attained by the embodiment of FIG. 2. Another advantage which is attained by the FIG. 10 embodiment is that the oscillation frequency of slave laser 18 is offset from the frequency of the absorption line within a wide frequency range by stepping down the beat frequency produced from lasers 11 and 18 by use of mixer 29. Furthermore, the oscillation frequency of slave laser 18 is swept by sweeping the microwaves produced by generator 27. In this embodiment, the oscillation frequency of slave laser 18 is controlled to the frequency $f_2 = f_1 + f_o$. The oscillation frequency of the slave laser 18 can also be controlled to the frequency $f_2 = f_1 - f_o$.

Figure 13:
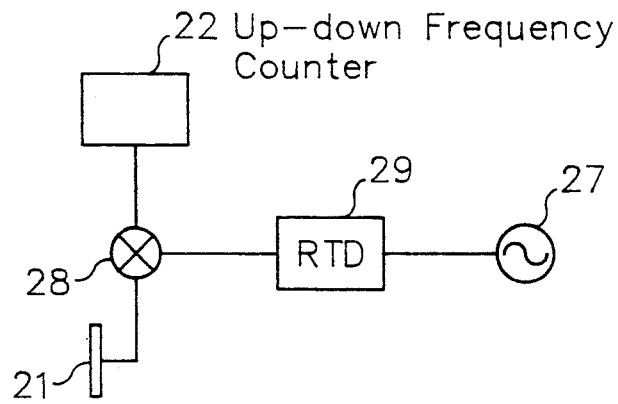
FIG. 13 is a block diagram depicting main portions of a modification of the fourth embodiment of FIG. 10.

In the FIG. 10 embodiment, also, high frequency mixing can be effected by adding the output from generator 27 to mixer 28 via a harmonic generator circuit 29, comprising a resonant tunneling diode (RTD) or the like, such as shown in FIG. 13. As an example, if the resonant tunneling diode 29 produces a frequency of 20 GHz, a synthesizer of 1 GHz is used as generator 27. In this case, an offset lock at 20 GHz can be made at the 20th harmonic. This makes it unnecessary to use a synthesizer in the frequency band of 20 GHz as generator 27. Hence, a wide band optical frequency synthesizer can be fabricated economically. Preset circuit 26, shown in FIG. 6, can also be used concurrently therewith. The blind spot of the offset frequency is eliminated by operating modulation amplitude control circuit 32 in response to the output frequency of second generator 27, in the same manner as in the embodiment of FIG. 7.

Figure 14:
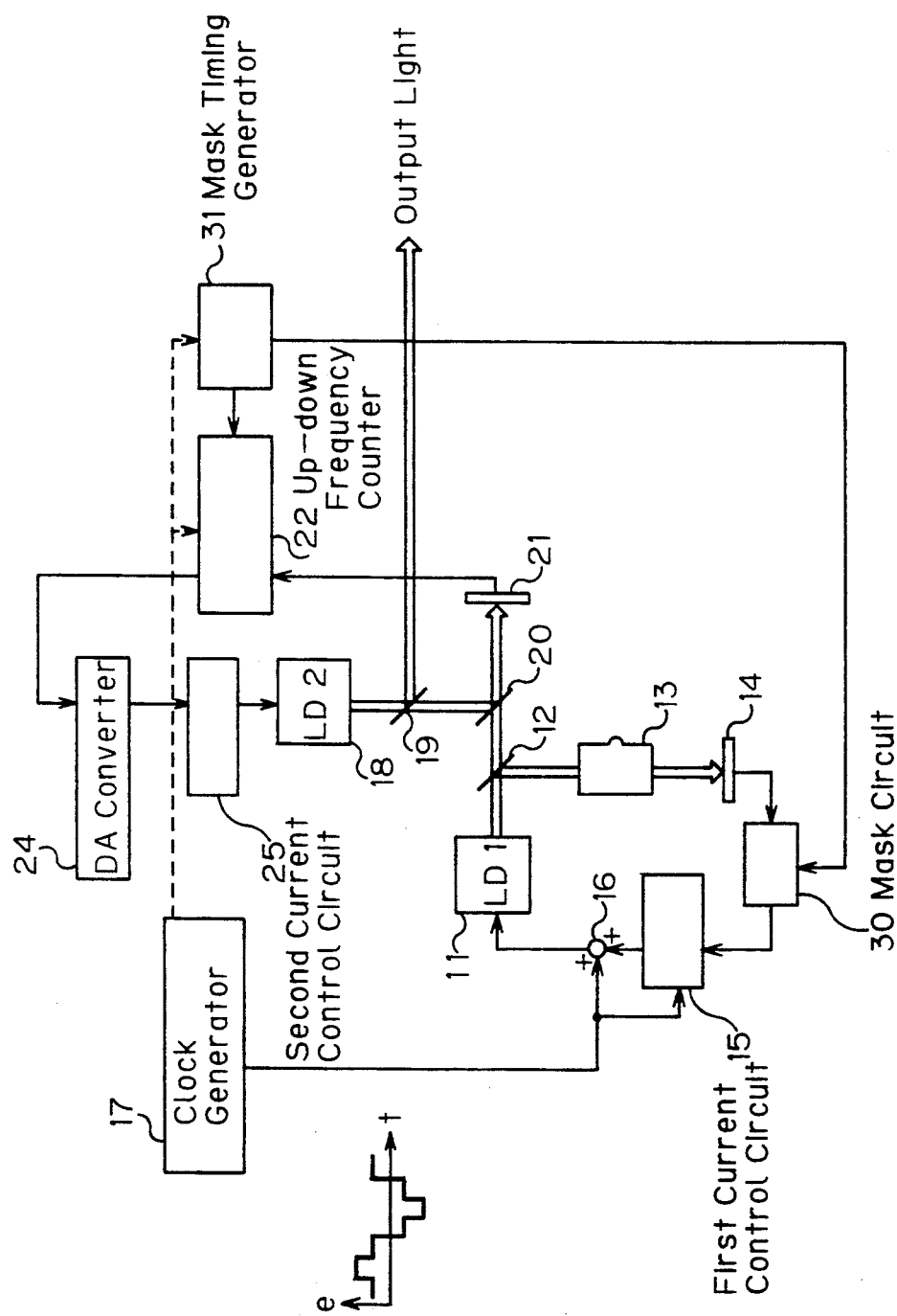
FIG. 14 is a block diagram depicting a fifth illustrative embodiment of the invention.

FIG. 14 depicts a stabilizer wherein the effects of the transient response characteristics occurring on the modulation of the master laser 11 are eliminated using masking functions. The embodiment of FIG. 14 is similar to the embodiment of FIG. 2 except for the following. Latch circuit 23 is omitted for clarity of illustration. A mask timing generator circuit 31 is added which produces a signal at a timing corresponding to the settling time of photodetector 14 that responds to the modulating output from generator 17. Also, a mask circuit 30 is added which passes the output from photodetector 14 to control circuit 15. During the settling time, mask circuit 30 inhibits the output from photodetector 14 from passing to control circuit 15 in response to the output from mask timing generator circuit 31. During the settling time, the counting operation of counter 22 is stopped in response to the output from mask timing generator circuit 31.

Figure 15:
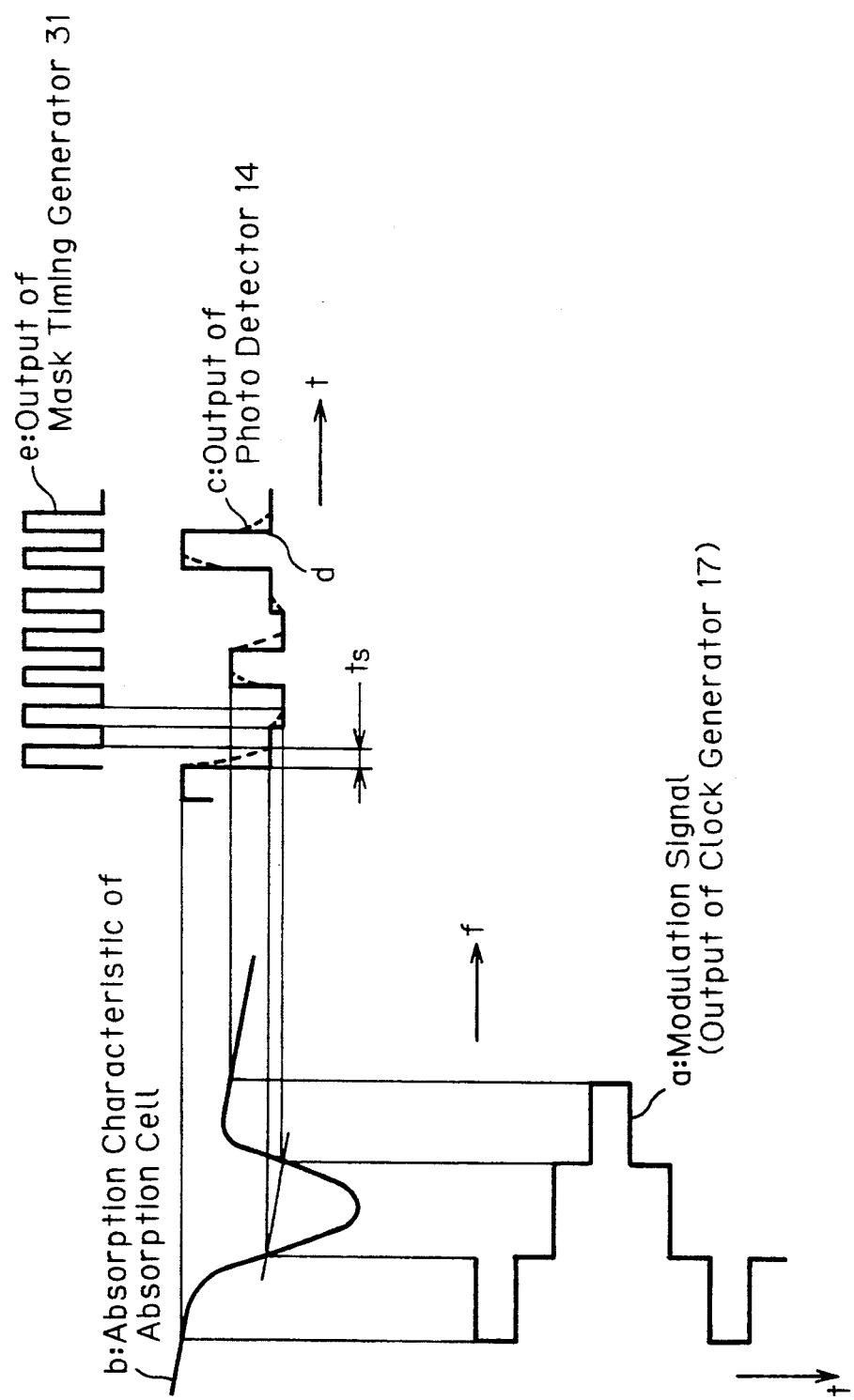
FIG. 15 is a diagram depicting the operation of the fifth embodiment of FIG. 14.

The function of mask circuit 30 is described with reference to FIG. 15. The output signal from master laser 11 is modulated with modulating signal a produced by clock generator 17, the modulating signal a assuming four different values. Absorption cell 13 shows absorption characteristics b. Photodetector 14 produces an output signal c indicated by the broken line. Since the frequency response band of the df/dI characteristic, i.e., variations in the frequency in response to changes in the current, is narrow, the waveform of signal c lags the ideal waveform d indicated by the solid line. There is a possibility that the frequency characteristic of df/dI varies with time. Thus, if the blunted portion of the waveform is used for control operation, then the frequency of the output light may drift with time. Accordingly, mask timing generator circuit 31 produces a mask timing signal e which is clocked to the output signal from clock generator 17 changing in a stepwise manner. The pulse width of signal e is equal to the settling time $t_s$. Mask circuit 30 inhibits the output from photodetector 14 from being sent to master laser 11 during the settling time $t_s$. Thus, counter 22 is stopped from counting. The result is that control operation is performed, using only the completely settled signal. Consequently, if the df/dI frequency characteristic varies with time, the apparatus is not affected at all by the variations.

The FIG. 14 embodiment yields the same advantages as those attained by the embodiment of FIG. 2. In addition, the effects of the transient response characteristics occurring on modulation of the master laser 11 are removed by the masking function. In this manner, if the df/dI characteristic of master laser 11 drifts with time, the apparatus is not affected by the drift. Thus, frequency stability is enhanced.

The invention thus realizes an optical laser frequency stabilizer whose oscillation frequency is controlled with high stability and which produces an unmodulated output with simple construction.

The foregoing description is illustrative of the principles of the invention. Numerous modifications and extensions thereof would be apparent to the worker skilled in the art. All such modifications and extensions thereof are to be considered to be within the spirit and scope of the invention.

What is claimed is:

1. An optical laser frequency stabilizer comprising
   a first laser which produces an output light;
   an absorption cell which is sealed with a reference substance showing an absorption line at a certain frequency and which transmits the output light from said first laser;
   first photodetector means for detecting light transmitted through said absorption cell;
   first generator means for producing a signal whose amplitude changes at least twice in the positive domain and at least twice in the negative domain so that the oscillation frequency of said first laser lies inside and outside the width of the absorption line, and for modulating the oscillation frequency of said first laser with said signal;

first control means for detecting the output signal from said first photodetector means in synchronism with the output signal from said first generator means to obtain a signal that becomes zero at the center of the absorption line, and for controlling the center frequency of said first laser to the center of the absorption line using the last mentioned signal;

a second laser;

an optical means for producing the sum of the output light from said first laser and the output light from said second laser;

second photoconductor means for detecting the output light from said optical means;

up-down frequency counter means for counting the beat frequency of a signal outputted by said second photodetecting means with the counting being synchronized with the output from said first generator means;

second control means for controlling the oscillation frequency of said second laser according to the output from said up-down counter means so that the oscillation frequency of said second laser coincides with the center frequency of the absorption line;

whereby said second laser outputs unmodulated light.

2. The stabilizer of claim 1, further comprising a preset circuit means for setting the up-down frequency counter means at a preset value; and wherein said second control means controls the oscillation frequency of said second laser to a value that is offset from the center frequency of the absorption line by a value corresponding to said preset value.

3. The stabilizer of claim 2, further comprising a modulation amplitude control means for changing the amplitude of the output signal from said first generator means when the beat frequency outputted from the second photodetector means becomes a null.

4. The stabilizer of claim 1, further comprising a second generator means for producing an output signal having an oscillation frequency, and multiplier means for producing a product of the output from said second generator means and the output from said second photodetector means, the output from said multiplier means being counted by said up-down counter means; and wherein said second control means controls the oscillation frequency of said second laser to a value that is offset from the center frequency of the absorption line by a value corresponding to the oscillation frequency of the output signal from said second generator means.

5. The stabilizer of claim 3, further comprising a modulation amplitude control means for changing the amplitude of the output signal from said first generator mean when the beat frequency outputted from the second photodetector means becomes a null.

6. The stabilizer of claim 1, further comprising a mask timing generator means for producing a signal at a timing corresponding to a settling time of said first photodetector means responding to the output from said first generator means; and a mask circuit means for responding to the output from said mask timing generator means and for inhibiting the output from said first photodetector means from being sent to said first control means during the settling time; and wherein said up-down frequency counter means is stopped from counting during the settling time in response to output from said mask timing generator means.

* * * * *